(12) United States Patent
Fujii et al.

(10) Patent No.: US 11,863,164 B2
(45) Date of Patent: Jan. 2, 2024

(54) QUANTUM CIRCUIT LEARNING DEVICE, QUANTUM CIRCUIT LEARNING METHOD, AND RECORDING MEDIUM

(71) Applicants: Kyoto University, Kyoto (JP); Osaka University, Suita (JP)

(72) Inventors: Keisuke Fujii, Kyoto (JP); Makoto Negoro, Suita (JP); Kosuke Mitarai, Suita (JP); Masahiro Kitagawa, Suita (JP)

(73) Assignees: KYOTO UNIVERSITY, Kyoto (JP); OSAKA UNIVERSITY, Osaka (JP)

(*) Notice: Subject to any disclaimer, the term of this patent is extended or adjusted under 35 U.S.C. 154(b) by 800 days.

(21) Appl. No.: 17/002,419

(22) Filed: Aug. 25, 2020

(65) Prior Publication Data

US 2020/0394550 A1 Dec. 17, 2020

Related U.S. Application Data

(63) Continuation of application No. PCT/JP2019/006456, filed on Feb. 21, 2019.

(30) Foreign Application Priority Data

Feb. 26, 2018 (JP) ................. 2018-032118

(51) Int. Cl.
*G06N 10/00* (2022.01)
*H03K 19/195* (2006.01)
*G06F 18/214* (2023.01)

(52) U.S. Cl.
CPC ......... *H03K 19/195* (2013.01); *G06F 18/214* (2023.01); *G06N 10/00* (2019.01)

(58) Field of Classification Search
None
See application file for complete search history.

(56) References Cited

U.S. PATENT DOCUMENTS

2017/0286858 A1   10/2017   La Cour et al.
2017/0364796 A1   12/2017   Wiebe et al.

OTHER PUBLICATIONS

Peruzzo, Alberto, et al. "A variational eigenvalue solver on a photonic quantum processor." Nature communications 5.1 (2014): 4213. (Year: 2014).*
Mitarai, Kosuke, et al. "Quantum circuit learning." Physical Review A 98.3 (2018): 032309. (Year: 2018).*
Herbert Jaeger, et al., Harnessing Nonlinearity: Predicting Chaotic Systems and Saving Energy in Wireless Communication, Science, Apr. 2, 2004, vol. 304, 78-80, 3 pages.

(Continued)

*Primary Examiner* — Daniel T Pellett
(74) *Attorney, Agent, or Firm* — Klintworth & Rozenblat IP LLP

(57) ABSTRACT

The quantum circuit learning device includes a signal input unit that provides a quantum circuit including plural quantum bits with an input signal, a signal acquisition unit that observes states of quantum bits that the quantum circuit includes and acquires an output signal based on the observed states, and an adjustment unit that adjusts a circuit parameter that defines a circuit configuration of the quantum circuit, using an output signal that the signal acquisition unit acquires and a cost function that is set based on a teacher signal corresponding to the output signal.

4 Claims, 6 Drawing Sheets

(56) References Cited

OTHER PUBLICATIONS

Jacob Biamonte et al., Quantum Machine Learning, Nature, vol. 549, 195-202, 8 pages.
Edward Farhi, et al., Classification with Quantum Neural Networks on Near Term Processors, arXiv:1802.06002, Feb. 16, 2018, 25 pages.
Jun Li, et al., Hybrid Quantum-Classical Approach to Quantum Optimal Control, https://arxiv.org/abs/1608.00677, Jan. 19, 2017, 13 pages.
Kosuke Mitarai, et al., Quantum Circuit Learning, http://arxiv.org/abs/1803.00745, Jan. 9, 2019, 10 pages.
Maria Schuld, et al., Evaluating Analytic Gradients on Quantum Hardware, http://arxiv.org/abs/1811.11184, Nov. 27, 2018, 11 pages.
Jonathan Romero, et al., Variational Quantum Generators: Generative Adversarial Quantum Machine Learning for Continuous Distributions, http://arxiv.org/abs/1901.00848, Jan. 3, 2019, 18 pages.
International Preliminary Report on Patentability issued in connection with International Patent Application No. PCT/JP2019/006456, completed Jun. 5, 2020, with English translation obtained from PATENTSCOPE, 25 pages.
International Search Report issued in connection with International Patent Application. No. PCT/JP2019/006456, dated Mar. 26, 2019, with English translation obtained from PATENTSCOPE, 7 pages.

* cited by examiner

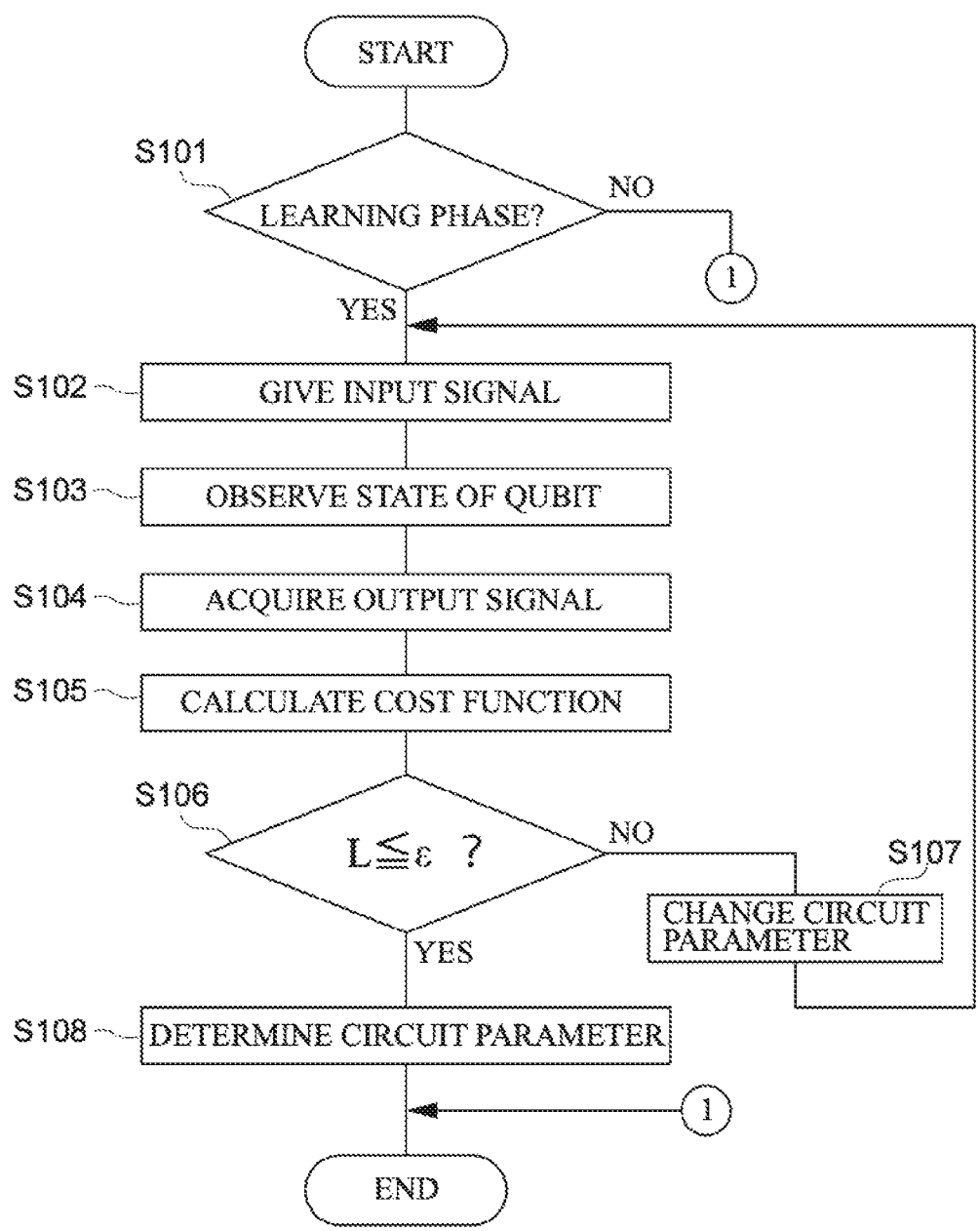

QUANTUM CIRCUIT LEARNING DEVICE, QUANTUM CIRCUIT LEARNING METHOD, AND RECORDING MEDIUM

CROSS-REFERENCE TO RELATED APPLICATION

This application is a continuation application of International Application No. PCT/JP2019/006456, filed Feb. 21, 2019, the disclosure of which is incorporated herein by reference in its entirety. Further, this application claims priority from Japanese Patent Application No. 2018-032118, filed Feb. 26, 2018, the disclosure of which is incorporated herein by reference in its entirety.

FIELD

The disclosed technology relates to a quantum circuit learning device, a quantum circuit learning method, and a recording medium.

BACKGROUND

A new framework of information processing capable of dealing with big data, which is difficult for a conventional computer system to deal with, has been expected to be developed in association with advancement of social networks and Internet of Things (IoT). As a possibility for such a new framework, machine learning using neural networks, which are configured using the human brain as a model, as software has been actively researched and developed in recent years and has been proving effective in image processing, image recognition, pattern matching, and nonlinear time series data processing, which have been conventionally difficult to process.

Regarding hardware, so-called quantum information processing in which an information processing system is constructed based on quantum mechanics, which is the most fundamental framework in physics, has been actively researched as a representative one of information processing devices the performance of which exceeds the limit of conventional semiconductor technologies, in expectation of enabling an exponential speed-up for some special problems, such as prime factor decomposition.

Related Non Patent Document

Non Patent Document 1: Jaeger, H. and Haas, H. "Harnessing nonlinearity: predicting chaotic systems and saving energy in wireless communication" Science 304, 78-80 (2004)

Non Patent Document 2: Jacob Biamonte et al., "Quantum machine learning" Nature, volume 549, 195-202 (2017)

SUMMARY

A quantum circuit learning device of the disclosed technology includes a signal input unit that provides a quantum circuit including a plurality of quantum bits with an input signal, a signal acquisition unit that observes states of quantum bits that the quantum circuit includes and acquires an output signal based on the observed states, and an adjustment unit that adjusts a circuit parameter that defines a circuit configuration of the quantum circuit, using an output signal that the signal acquisition unit acquires and a cost function that is set based on a teacher signal corresponding to the output signal.

A quantum circuit learning device of the disclosed technology, comprising: a memory; and a processor coupled to the memory, the processor being configured to perform a process comprising: providing a quantum circuit $U(\{\theta_k\})$, which includes a plurality of quantum bits, with an input signal $x^{(j)}$, wherein $\theta_k$ is a circuit parameter that defines a circuit configuration of the quantum circuit $U(\{\theta_k\})$, k is an index of the circuit parameter, and j is an index of the signal; observing states of the quantum bits included in the quantum circuit $U(\{\theta_k\})$ and acquiring a value $<A(x^{(j)}, \{\theta_k\})>$ that is calculated from an output of the quantum circuit $U(\{\theta_k\})$ based on the observed states; adjusting the circuit parameter $\theta_k$, using the acquired value $<A(x^{(j)}, \{\theta_k\})>$ and using a cost function that is set based on a teacher signal $y^{(j)}$ corresponding to the value $<A(x^{(j)}, \{\theta_k\})>$; and at a time of adjusting an l-th circuit parameter $\theta_l$ in the circuit parameter $\theta$, calculating a gradient in accordance with the following Formula (1), the gradient being calculated from a difference between a value $<A(x^{(j)}, \{\theta_l, \ldots, \theta_{l+\epsilon}, \theta_{l+l}, \ldots\})>$ calculated from an output of the quantum circuit $U(\{\theta_k\})$ in a case in which the l-th circuit parameter $\theta_l$ is increased by a set value $\epsilon$, and a value $<A(x^{(j)}, \{\theta_l, \ldots, \theta_{l-\epsilon}, \theta_{l+l}, \ldots\})>$ calculated from an output of the quantum circuit $U(\{\theta_k\})$ in a case in which the l-th circuit parameter $\theta_l$ is decreased by the set value $\epsilon$, and adjusting the circuit parameter $\theta_l$ in such a way as to minimize the cost function by means of a gradient method, using the calculated gradient value:

$$\frac{\partial}{\partial \theta_l} \langle A(x^{(j)}, \{\theta_k\}) \rangle = \qquad \text{[Formula 1]}$$

$$\frac{1}{2\sin(\epsilon)} (\langle A(x^{(j)}, \{\theta_1, \ldots \theta_l + \epsilon, \theta_{l+1}, \ldots\}) \rangle -$$

$$\langle A(x^{(j)}, \{\theta_1, \ldots \theta_l - \epsilon, \theta_{l+1}, \ldots\}) \rangle)$$

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a flowchart describing processing steps that are performed in the quantum information processing system according to the embodiment.

DESCRIPTION OF EMBODIMENTS

Hereinafter, the disclosed technology will be specifically described based on the drawings illustrating an embodiment of the disclosed technology.

Figure 1:
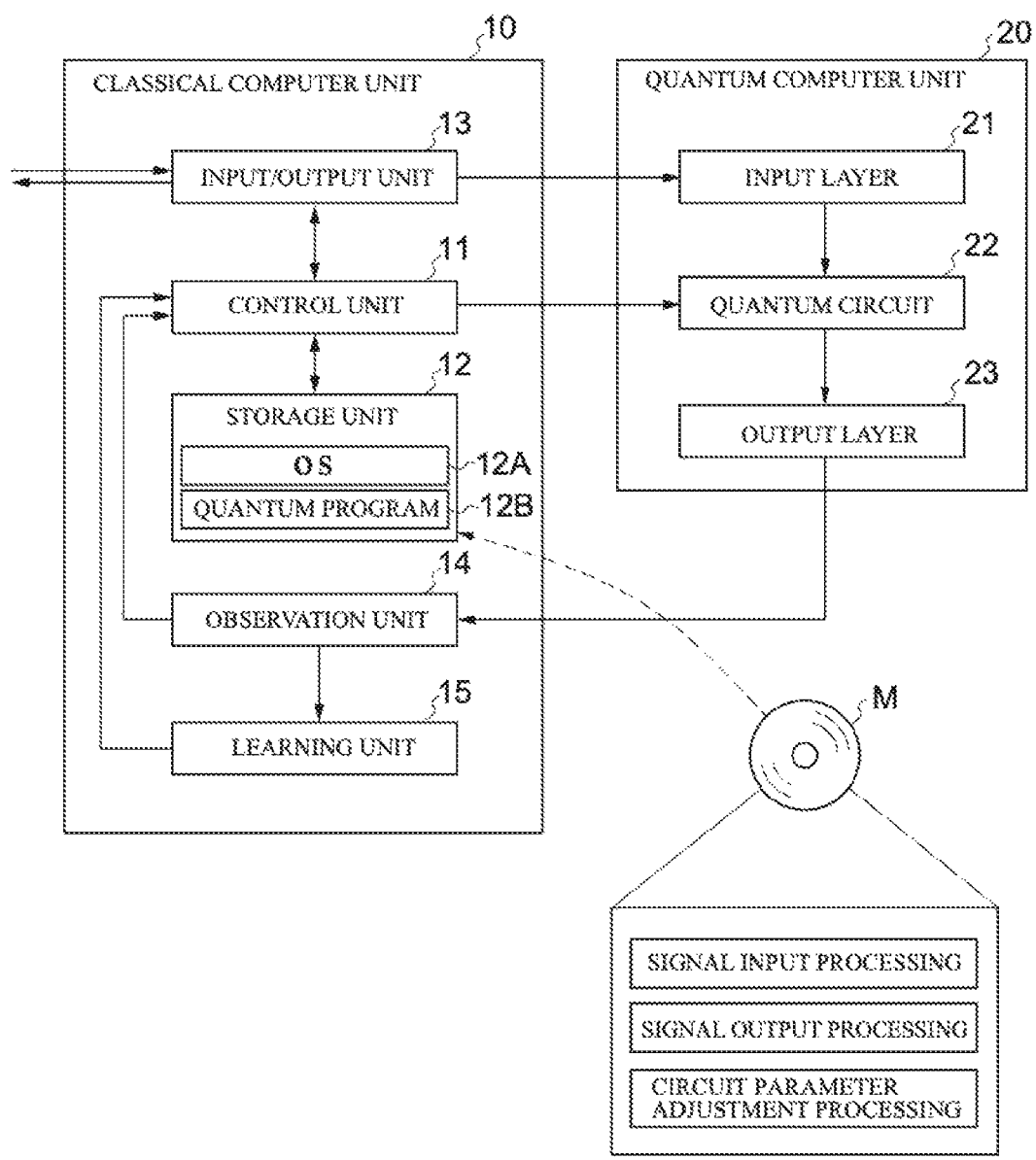
FIG. 1 is a block diagram describing an overall configuration of a quantum information processing system according to an embodiment.

FIG. 1 is a block diagram describing an overall configuration of a quantum information processing system according to the embodiment. The quantum information processing system according to the embodiment includes a classical computer unit 10 that functions as a classical computer that processes binary bit data and a quantum computer unit 20 that includes a quantum system composed of a plurality of quantum bits mutually interacting with one another and outputs a signal acquired based on superposition of states of respective quantum bits.

The classical computer unit 10 includes a control unit 11, a storage unit 12, an input/output unit 13, an observation unit 14, and a learning unit 15.

The control unit 11 includes, for example, a central processing unit (CPU), a read only memory (ROM), a random access memory (RAM), and the like. The CPU in the control unit 11 controls operation of the classical computer unit 10 and the quantum computer unit 20 by executing various types of programs that are stored in the ROM or the storage unit 12 in advance. The RAM in the control unit 11 temporarily stores data and the like generated during execution of the various types of programs.

Although, in the embodiment, a configuration for controlling operation of the quantum computer unit 20, using the control unit 11, which includes the CPU, the ROM, the RAM, and the like, will be described, the configuration of the control unit 11 is not limited to this configuration and the control unit 11 is only required to be any processing circuit that includes a multicore CPU, a graphic processing unit (GPU), a microcomputer, a field programmable gate array (FPGA), an analog circuit, and the like. The control unit 11 may also include a clock that outputs date and time information, a timer that measures elapsed time from a point of time at which a measurement start instruction is given to a point of time at which a measurement end instruction is given, a counter that counts a number, and the like.

Although, in the embodiment, the classical computer unit 10 is assumed to have a configuration including the control unit 11, the storage unit 12, the input/output unit 13, the observation unit 14, and the learning unit 15, it is obvious that functions of the learning unit 15 may, for example, be achieved by another computer, a virtual computer, or the like that is independent of the classical computer unit 10.

The storage unit 12 includes a storage device, such as a hard disk drive (HDD), and stores various types of programs and data. Programs that the storage unit 12 stores include an operating system (OS) 12A that is a program for controlling overall operation of the classical computer unit 10 and a program (quantum program) 12B for controlling operation of the quantum computer unit 20. Data that the storage unit 12 stores include input data to be input to the quantum computer unit 20, control data that are necessary to control the operation of the quantum computer unit 20, and the like.

The quantum program 12B may be a program provided by a non-transitory recording medium M that records the program in a readable manner. The recording medium M is a portable memory, such as a CD-ROM, a USB memory, a secure digital (SD) card, a micro SD card, and a COMPACTFLASH (registered trademark). In this case, the classical computer unit 10 included in the quantum information processing system may read the quantum program 12B from the recording medium M, using a not-illustrated reading device and install the read quantum program 12B in the storage unit 12. In a case in which the classical computer unit 10 includes a communication unit and is capable of communicating with an external communication device through the communication unit, the quantum program 12B may be provided by communication through the communication unit. In this case, the classical computer unit 10 may acquire the quantum program 12B from the external communication device through the communication unit and install the acquired quantum program 12B in the storage unit 12.

The input/output unit 13 includes an input/output interface to which an input device, such as a keyboard and a mouse, and an output device, such as a display device, are connected. The input/output unit 13 transmits data input through the input device to the control unit 11, and the control unit 11 performs various types of processing, based on the data from the input/output unit 13. In a case in which the control unit 11 acquires data of which a user needs to be informed, such as output data output from the quantum computer unit 20, the control unit 11 outputs the data to the output device through the input/output unit 13.

The observation unit 14 is connected to an output layer 23 of the quantum computer unit 20 and acquires output data read from a quantum circuit 22, through the output layer 23. The observation unit 14 transmits the acquired output data to the control unit 11.

The learning unit 15 includes a memory (not illustrated) for storing teacher data that indicate ideal output data with respect to input data to be input to the quantum computer unit 20. The learning unit 15 is connected to the output layer 23 and learns a circuit parameter $\theta$ that defines a circuit configuration of the quantum circuit 22, based on output data read through the output layer 23 and the teacher data stored in advance. The circuit parameter $\theta$ determined by the learning unit 15 is fed back to the quantum circuit 22 through the control unit 11. The circuit parameter $\theta$ does not have to be a single parameter and may be a parameter group composed of a plurality of parameters.

Although, in the embodiment, the classical computer unit 10 is assumed to have a configuration including the learning unit 15 as an independent constituent element, the control unit 11 may be provided with functions of the learning unit 15. In this case, processing steps at the time of learning the circuit parameter $\theta$ is provided by the quantum program 12B, and the teacher data is, for example, stored in the storage unit 12. The control unit 11 achieves the functions of the learning unit 15 by executing the quantum program 12B in a learning phase and thereby learning the circuit parameter $\theta$, which defines the quantum circuit 22, based on the output data from the quantum computer unit 20 acquired through the observation unit 14 and the teacher data read from the storage unit 12 and performing feedback of the circuit parameter $\theta$ to the quantum circuit 22.

The quantum computer unit 20 includes an input layer 21, the quantum circuit 22, and the output layer 23.

The input layer 21 outputs a signal based on input data input from the classical computer unit 10 to quantum bits that the quantum system in the quantum circuit 22 includes. A signal to be output to the quantum bits may be a binary signal taking a value of 0 or 1 (or −1 or +1) or a continuously variable signal taking a value in a range of from 0 to 1 (or from −1 to +1).

The quantum circuit 22 includes a quantum system that is configured with a plurality of quantum bits that mutually interact with one another and the circuit configuration of which is defined by the circuit parameter $\theta$. As the quantum system, any controllable quantum system including a physical system that behaves based on quantum mechanics and is represented by, for example, a liquid or solid nuclear magnetic resonance (NMR) quantum spin ensemble, a superconducting quantum circuit, trapped ions, quantum dots, or neutral atoms on an optical lattice can be used. The circuit parameter θ, which defines the circuit configuration of the quantum circuit 22, is, for example, an operator that rotates one of the quantum bits about any rotation axis by a preset angle.

The output layer 23 includes an observation means, such as a single electron transistor, a superconducting amplifier and detector, a coil detecting electromagnetic waves, and a photon detector, corresponding to each quantum bit. The output layer 23 reads output data using the circuit parameter θ, which is determined by the learning unit 15, by observing a state of each quantum bit and applying an appropriately selected output function F (which will be described later) to the observed states of the quantum bits. On this occasion, the output layer 23 may acquire an average of a physical quantity by performing sampling through repeating observation multiple times, if necessary.

Although the above-described quantum information processing system is assumed to have a configuration in which the classical computer unit 10 and the quantum computer unit 20 are separated from each other for convenience, the quantum information processing system does not necessarily have to include the classical computer unit 10 and the quantum computer unit 20 separately and may be constructed as a system (device) that integrally includes the classical computer unit 10 and the quantum computer unit 20.

Figure 2:
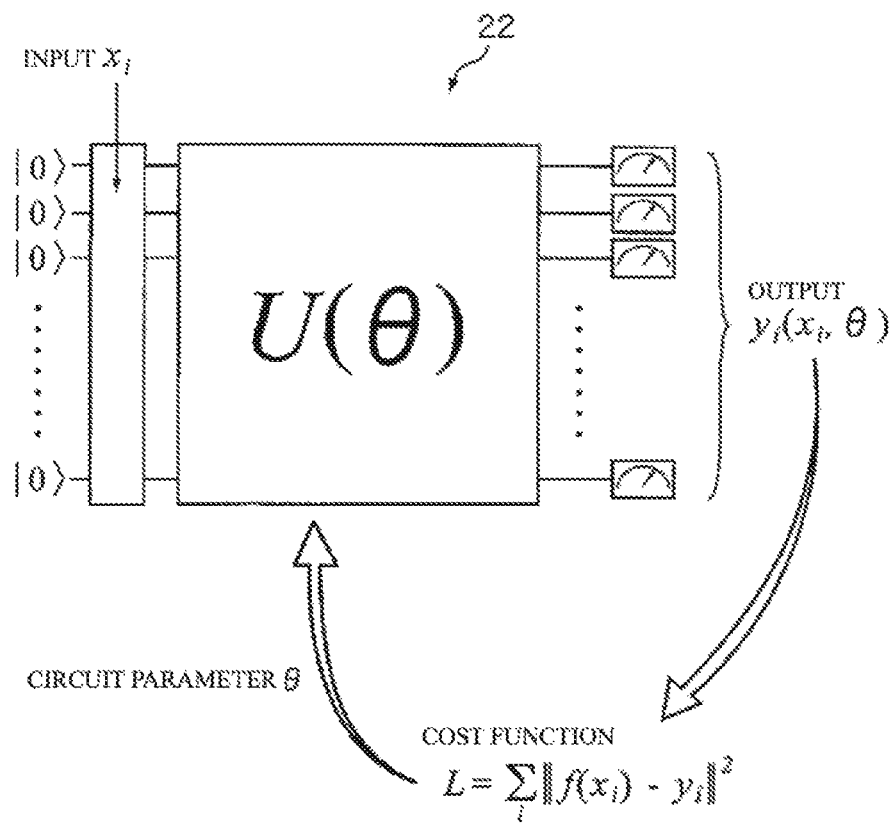
FIG. 2 is an explanatory diagram describing dynamics of a quantum system that a quantum circuit includes.

FIG. 2 is an explanatory diagram describing dynamics of the quantum system that the quantum circuit 22 includes. It is assumed that the quantum system, which the quantum circuit 22 includes, includes as constituent elements N (N is an integer of 2 or more) quantum bits.

In order to utilize quantum dynamics for information processing, input signals $x_i$ (I=1, 2, 3, . . . ) to the quantum system, which the quantum circuit 22 includes, are introduced. Each input signal $x_i$ represents a static digital signal, such as an image signal. In the quantum circuit 22, in a case in which an input signal $x_i$ is given to initialized quantum bits (qubits), an input state $|\psi_{in}(x_i)\rangle$ of the qubits is replaced with $|\psi_{in}(x_i)\rangle = V(x_i)|0\rangle$. In this expression, $V(x_i)$ denotes a unitary input gate.

In the embodiment, the control unit 11 applies a unitary operator $U(\theta)$ that is parameterized by the circuit parameter θ of the quantum circuit 22 to the input state. This operation causes $|\psi_{out}(x_i, \theta)\rangle = U(\theta)|\psi_{in}(x_i)\rangle$ to be acquired as an output state. In this expression, $U(\theta)$ may be a quantum circuit composed of basic quantum operators with parameters, such as rotation angles, and may include time evolution generated by a Hamiltonian. The quantum circuit 22 may include not only the unitary operator $U(\theta)$ but also another quantum circuit that does not depend on the circuit parameter θ or any processing circuit.

A signal acquired from each qubit is defined by a result of projective measurement of a physical quantity that is locally observable in the qubit or an average of the physical quantity acquired by repeatedly sampling the physical quantity. A Pauli operator $\{B_j\}$ that acts on a j-th qubit is used as an observable physical quantity herein. For example, in a case in which spin is used as a qubit, the observable physical quantity corresponds to magnetic susceptibility of the nuclear spin. An output signal that is acquired by applying the Pauli operators $\{B_j\}$ is, for example, expressed by $y(x_i, \theta) = F(\{B_j(x_i), \theta)\})$. In this expression, F denotes an appropriate output function.

In the learning phase in which the circuit parameter θ in the quantum circuit 22 is adjusted, optimization of the circuit parameter θ is performed using a cost function. The cost function is expressed by, for example, the following Formula, using, for example, an output signal $y_i$ from the quantum computer unit 20 and a teacher signal $f(x_i)$ that indicates an ideal output signal with respect to an input signal $x_i$.

$$L = \sum_i \|f(x_i) - y_i\|^2 \qquad \text{[Math. 1]}$$

In the above Formula, $y_i$ is an output signal that is read from the quantum computer unit 20 in a case in which the input signal $x_i$ and a circuit parameter $\theta = \{\theta_i\}$ are given.

An operator $|\Box|$ denotes a Euclidean norm.

In a case in which the learning unit 15 acquires the output signal $y_i$, which is an output from the quantum computer unit 20, in the learning phase in which the circuit parameter θ of the quantum circuit 22 is optimized, the learning unit 15 adjusts the circuit parameter θ in such a way as to minimize the above-described cost function, which is set using the output signal $y_i$ and the teacher signal $f(x_i)$.

In the embodiment, the cost function is not limited to Formula of Math. 1. For example, a cost function expressed by the following Formula may be used.

$$L = -\sum_i f(x_i) \log y_i \qquad \text{[Math. 2]}$$

Operation of the quantum information processing system at the time of adjusting the circuit parameter θ in the quantum circuit 22 will be described below.

FIG. 3 is a flowchart describing processing steps that are performed in the quantum information processing system according to the embodiment. The operation described by the flowchart in FIG. 3 is achieved by the control unit 11 reading and executing various types of programs, such as the OS 12A and the quantum program 12B, stored in the storage unit 12 and controlling operation of the respective units that the classical computer unit 10 and the quantum computer unit 20 include.

The control unit 11 determines whether or not the operation is currently in a learning phase in which the circuit parameter θ of the quantum circuit 22 is learned (step S101). In the case of determining that the operation is not in the learning phase (S101: NO), the control unit 11 terminates the processing performed in accordance with the flowchart without performing the following processing.

In a case in which the control unit 11, for example, accepts a change instruction to transition from an operation phase to the learning phase through the input/output unit 13, the control unit 11 determines that the operation is currently in the learning phase (S101: YES) and gives an input signal based on an input data $\{x_i\}$ to be processed to the quantum circuit 22 through the input layer 21 of the quantum computer unit 20 (step S102). That is, applying a unitary input gate $V(x_i)$ to initialized qubits $|0\rangle$ causes $$|\psi_{in}(x_i)\rangle = V(x_i)|0\rangle$$

to be acquired as an input state. It may also be assumed that, using as an input $g(x_i)$ that is obtained by applying an appropriate nonlinear function g to the input signal $x_i$, $$|\psi_{in}(x_i)\rangle = V(g(x_i))|0\rangle$$

is acquired.

In the quantum circuit 22, nonlinearity is induced by a tensor product structure of the quantum system and the unitary input gate $V(x_i)$. The nonlinearity may also be induced by performing quantum analog-digital conversion on a quantum state that is acquired by applying the unitary operator $U(\theta)$ to an input state, storing analog information of a wave function in a quantum random access memory as digital quantum information, performing nonlinear conversion with the quantum state treated as digital quantum information, and performing the quantum analog-digital conversion again. That is, the quantum circuit 22 may include not only the unitary operator $U(\theta)$ but also a first quantum analog-digital conversion A that converts analog information to digital information, another quantum circuit R relating to nonlinear operation, and a second quantum analog-digital conversion circuit D that converts digital information to analog information.

The control unit 11 applies the unitary operator $U(\theta)$, which is parameterized by the circuit parameter $\theta$ of the quantum circuit 22, to the input state. This operation causes $$|\psi_{out}(x_i,\theta)\rangle = U(\theta)|\psi_{in}(x_i)\rangle$$

to be acquired as an output state.

Next, the observation unit 14 observes a state of a selected qubit of the quantum circuit 22 (step S103) and acquires an output signal through the output layer 23 (step S104). The output layer 23 may acquire as an output signal an expectation of a physical quantity by repeatedly performing sampling on an observation result multiple times, if necessary. An output signal $y_i = y(x_i, \theta)$ can be expressed as $$y(x_i,\theta) = F(\{B_j(x_i,\theta)\}),$$

using a Pauli operator $\{B_j\}$. In this expression, F denotes an appropriate output function.

The learning unit 15 calculates a cost function $L(f(x_i), y(x_i, \theta))$ that is set based on the output signal $y_i$, which is input through the observation unit 14, and a teacher signal $f(x_i)$ that indicates an ideal output with respect to the input signal $x_i$ (step S105).

Next, the learning unit 15 determines whether or not the calculated value of the cost function L is equal to or less than a threshold value $\varepsilon$ (step S106). The threshold value $\varepsilon$ is a threshold value for determining whether or not the cost function has converged, and an appropriate minuscule value is set to the threshold value $\varepsilon$.

In a case in which it is determined that the calculated value of the cost function L is not equal to or less than the threshold value $\varepsilon$ (S106: NO), the learning unit 15 changes the circuit parameter $\theta$ (step S107). For example, in a case in which the circuit parameter $\theta$ includes an operator that rotates a qubit constituting the quantum circuit 22 about any rotation axis, the learning unit 15 may change the circuit parameter $\theta$ by changing the rotation angle of the operator. In a case in which the quantum circuit 22 is a quantum annealing machine or a quantum circuit produced by digitizing a quantum annealing machine, the learning unit 15 may change the circuit parameter $\theta$ by changing coupling constants between qubits.

The learning unit 15 may set the circuit parameter $\theta$ by keeping values of the cost function L that were calculated in step S105 and using a gradient method in such a way that a cost function value $L_n$ calculated at this time becomes less than a cost function value $L_{n-1}$ calculated at the previous time. A gradient value of the cost function with respect to a parameter can be acquired by appropriately changing the circuit configuration of the quantum circuit 22 partially and performing direct observation using the same method as regular reading.

The learning unit 15 may adjust the circuit parameter $\theta$, using a gradient that is calculated based on a difference between an output of the quantum circuit 22 in a case in which the circuit parameter $\theta$ is increased by a set value $\varepsilon$ (for example, $\pi/2$ at which the difference is maximized) and an output of the quantum circuit 22 in a case in which the circuit parameter $\theta$ is decreased by $\varepsilon$.

A value calculated from the output of the quantum circuit 22 can, for example, be expressed as the following Formula.

$$\langle A(x, \{\theta_k\})\rangle = \langle 0|^{\otimes n} V^\dagger(x) U(\{\theta_k\})^\dagger A U(\{\theta_k\}) V(x)|0\rangle^{\otimes n} \quad \text{[Math. 3]}$$

In this Formula, $V(x)$ is a quantum operation for input, and $U(\{\theta_k\})$ is a parameterized quantum circuit. On this occasion, in a case in which it is assumed that teacher data are denoted by $\{x^{(j)}, y^{(j)}\}$, the cost function $L(\{\theta_k\})$ can be expressed as the following Formula.

$$L(\{\theta_k\}) = \sum_j (\langle A(x^{(j)}, \{\theta_k\})\rangle - y^{(j)})^2 \quad \text{[Math. 4]}$$

The gradient of the cost function $L(\{\theta_k\})$ is expressed by the following Formula.

$$\frac{\partial}{\partial \theta_l} L(\{\theta_k\}) = \frac{\partial}{\partial \theta_l} \sum_j (\langle A(x^{(j)}, \{\theta_k\})\rangle - y^{(j)})^2 \quad \text{[Math. 5]}$$
$$= \sum_j 2(\langle A(x^{(j)}, \{\theta_k\})\rangle - y^{(j)}) \frac{\partial}{\partial \theta_l} \langle A(x^{(j)}, \{\theta_k\})\rangle$$

That is, in order that the cost function is an analytic function, it is sufficient that a partial differential of the output <A> can be calculated. For example, in a case in which $U(\{\theta_k\})$ is expressed by Formula of Math. 6 and if $P_k$ satisfies $P_k^2 = I$, it is possible to calculate the partial differential of the cost function $L(\{\theta_k\})$ analytically and the partial differential of the output <A> can be expressed as Formula of Math. 7. In addition, $\varepsilon$ in Math. 7 is a set value that is set in advance.

$$U(\{\theta_k\}) = \prod_k W_k e^{-i(\theta_k/2) P_k} \quad \text{[Math. 6]}$$

$$\frac{\partial}{\partial \theta_l} \langle A(x^{(j)}, \{\theta_k\})\rangle = \frac{1}{2\sin(\varepsilon)} (\langle A(x^{(j)}, \{\theta_1, \ldots \theta_l + \varepsilon, \theta_{l+1}, \ldots \})\rangle - \quad \text{[Math. 7]}$$
$$\langle A(x^{(j)}, \{\theta_1, \ldots \theta_l - \varepsilon, \theta_{l+1}, \ldots \})\rangle)$$

As expressed by Math. 7, the learning unit 15 is able to calculate a gradient, based on a difference between an output of the quantum circuit 22 in a case in which the l-th circuit parameter is shifted by $+\varepsilon$ and an output of the quantum circuit 22 in a case in which the l-th circuit parameter is shifted by $-\varepsilon$. The learning unit 15 is only required to adjust the quantum parameter $\theta$, based on the calculated gradient.

The learning unit 15 outputs the changed value of the circuit parameter $\theta$ to the control unit 11. The control unit 11 changes the circuit configuration of the quantum circuit 22, based on the circuit parameter θ output from the learning unit 15 and returns the processing to step S102.

In a case in which it is determined that the calculated value of the cost function L is equal to or less than the threshold value ε (S106: YES), the learning unit 15 determines the value of the circuit parameter θ at this time as a value of the circuit parameter θ to be used in the operation phase (step S108). The learning unit 15 outputs the determined circuit parameter θ to the control unit 11 and terminates the processing performed in accordance with the flowchart.

Results of numerical simulations in which typical machine learning tasks were performed using the quantum information processing system according to the embodiment will be described below.

Figure 4A:
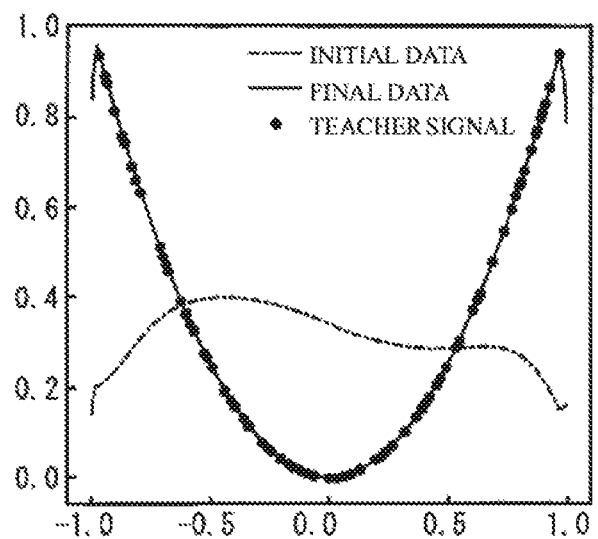
FIG. 4A is a graph illustrating a result of fitting to a nonlinear function.
Figure 4B:
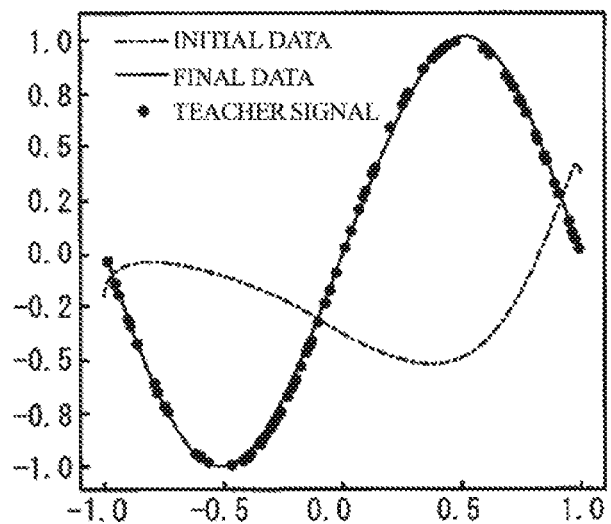
FIG. 4B is a graph illustrating a result of fitting to another nonlinear function.
Figure 5A:
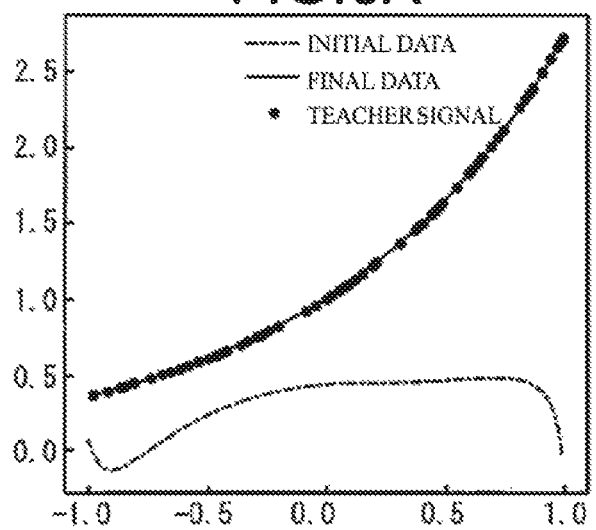
FIG. 5A is a graph illustrating a result of fitting to still another nonlinear function.
Figure 5B:
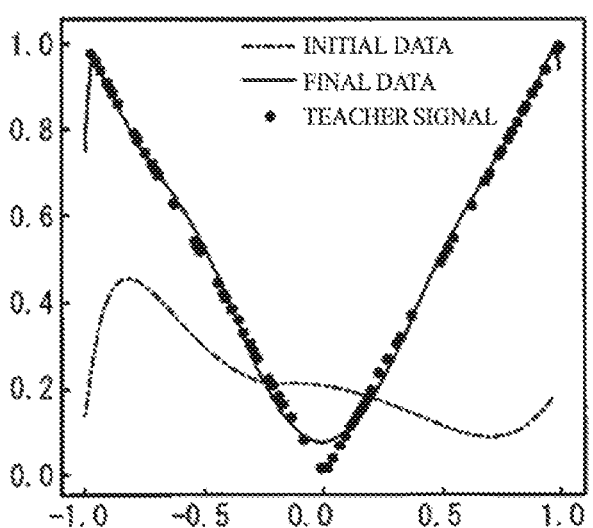
FIG. 5B is a graph illustrating a result of fitting to still another nonlinear function.

FIGS. 4A, 4B, 5A, and 5B are graphs illustrating results of fitting to nonlinear functions. FIGS. 4A and 4B illustrate results of fitting to $P(x)=x^2$ and sin x, respectively, and FIGS. 5A and 5B illustrate results of fitting to $P(x)=ex$ and $|x|$, respectively.

The abscissa and ordinate of each graph represent an input value x to a function and an output value P(x) of the function, respectively. The alternate long and short dash line and solid line in each graph indicate an output (initial data) of the quantum computer unit 20 in a case in which the circuit parameter θ is set at random and an output (final data) of the quantum computer unit 20 in a case in which the circuit parameter θ is optimized, respectively. Filled circles in each graph indicate teacher data that were used at the time of optimizing the circuit parameter θ.

It is revealed that all the functions can be reproduced with high precision by optimizing the circuit parameter θ in the quantum circuit 22, using a framework of quantum circuit learning according to the embodiment.

Figure 6A:
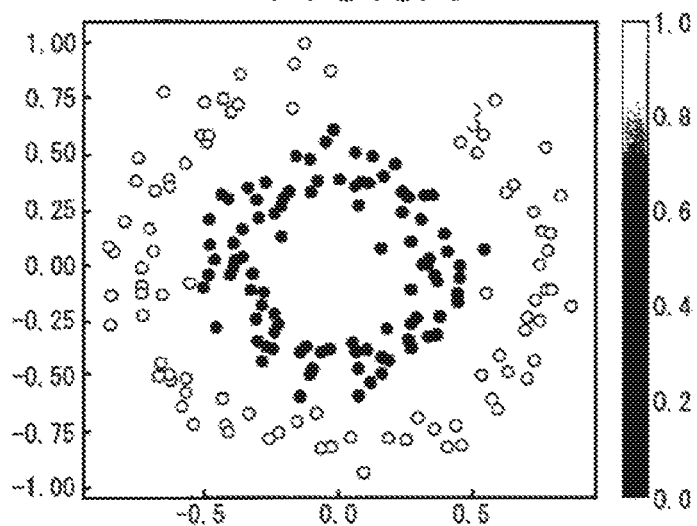
FIG. 6A is an explanatory diagram describing an application example to a classification problem.
Figure 6B:
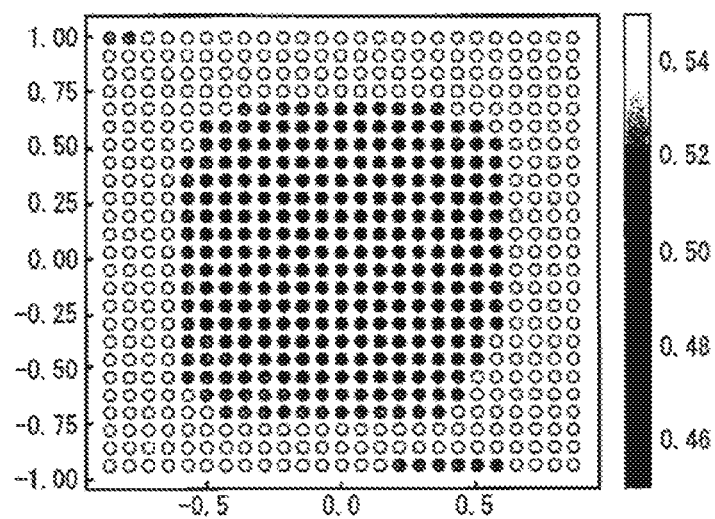
FIG. 6B is another explanatory diagram describing the application example to the classification problem.

FIGS. 6A and 6B are explanatory diagrams describing an application example to a classification problem. FIG. 6A illustrates an example of teacher data. Filled circles and unfilled circles illustrated in FIG. 6A represent points belonging to a class 0 and points belonging to a class 1, respectively. The example in FIG. 6A indicates that in total 200 points representing the teacher data (each of the numbers of points belonging to the class 0 and points belonging to the class 1 is 100) are distributed in a range of x=−1 to +1 and y=−1 to +1.

FIG. 6B illustrates optimized output values from the qubits after Softmax conversion has been performed. In FIG. 6B, an output value "0.5" indicates a threshold value in the classification, and a value equal to or greater than the threshold value (that is, a value of 0.5 or greater) represents a point to be classified into the class 1 and a value less than the threshold value (that is, a value of less than 0.5) represents a point to be classified into the class 0. The output result in FIG. 6B indicates that points in a region on the outside of an annular region indicated by gray points are points to be classified into the class 1 and points in a region on the inside of the annular region are points to be classified into the class 0, and it is revealed that the distribution of the teacher data illustrated in FIG. 6A is appropriately classified.

As illustrated in FIG. 6B, it is possible to solve a nonlinear classification problem by optimizing the circuit parameter θ in the quantum circuit 22, using the framework of quantum circuit learning, in the embodiment.

As described above, it is possible to adjust the circuit parameter of the quantum circuit 22, which is used for generalization, prediction, and the like, to an appropriate value, in the embodiment. This capability enables a quantum algorithm to be provided that operates in a quantum computer expected to be achieved in the near future and capable of running a shallow circuit using 50 to 100 qubits and that is capable of executing practical machine learning tasks. This capability also enables a systematic adjustment method in a case in which the number of circuit parameters has increased to be provided and a setting method of a cost function and an embedding method of input into a quantum state in the case of performing supervised learning to be provided.

The framework of quantum circuit learning according to the embodiment may be used for optimization of precision improvement in the quantum circuit 22. For example, a situation is considered in which, although a quantum calculation W is expected to be executed with as high fidelity as possible, a quantum calculation W' that is experimentally achieved is caused to be a quantum calculation that is substantially different from the ideal quantum calculation W and has a low fidelity because the quantum calculation W' includes an unknown parameter.

In this case, an input-output relationship $\{x_i\}$ and $\{y_i\}$ for the ideal quantum calculation W is prepared in advance. The circuit parameter θ is determined using the framework of quantum circuit learning according to the embodiment in such a way that the quantum circuit 22 (unitary operator U(θ)) that has a well-controlled circuit parameter θ is made to operate on the quantum calculation W', which is experimentally achieved, and $U(θ)W'|x_i\rangle$ that is acquired through the operation indicates the ideal output signal $y_i$. Use of the determined circuit parameter θ enables U(θ)W' that has a high fidelity (that is close to the ideal quantum calculation W) to be achieved and fidelity of quantum calculation to be improved.

The embodiment disclosed herein should be considered as illustrative in all aspects rather than restrictive. The scope of the disclosed technology is defined by the terms of claims, rather than the description above, and is intended to include any modifications within the scope and meaning equivalent to the terms of claims.

In the case of related technology, designing a quantum circuit properly and cutting off noise from the outside and thereby achieving a universal quantum computer have remained to be difficult tasks. There is also a problem in that no application method of quantum circuits to information processing tasks having high general versatility like ones dealt with in the machine learning field has been established.

The disclosed technology has been made in consideration of the above-described problems, and an object of the disclosed technology is to provide a quantum circuit learning device, a quantum circuit learning method, a computer program, and a recording medium that are capable of adjusting a circuit parameter in a quantum circuit and applicable to information processing tasks.

The disclosed technology enables a circuit parameter in a quantum circuit to be adjusted and application to information processing tasks to be achieved.

The disclosures of Japanese Patent Application No. 2018-032118, Feb. 26, 2018 is incorporated herein by reference in their entirety.

All publications, patent applications, and technical standards mentioned in this specification are herein incorporated by reference to the same extent as if each individual publication, patent application, or technical standard was specifically and individually indicated to be incorporated by reference.

The invention claimed is:

1. A quantum circuit learning device, comprising:
a memory; and a processor coupled to the memory, the processor being configured to perform a process comprising:

providing a quantum circuit $U(\{\theta_k\})$, which includes a plurality of quantum bits, with an input signal $x^{(j)}$, wherein $\theta_k$ is a circuit parameter that defines a circuit configuration of the quantum circuit $U(\{\theta_k\})$, k is an index of the circuit parameter, and j is an index of the signal;

observing states of the quantum bits included in the quantum circuit $U(\{\theta_k\})$ and acquiring a value $<A(x^{(j)}, \{\theta_k\})>$ that is calculated from an output of the quantum circuit $U(\{\theta_k\})$ based on the observed states;

adjusting the circuit parameter $\theta_k$, using the acquired value $<A(x^{(j)}, \{\theta_k\})>$ and using a cost function that is set based on a teacher signal $y^{(j)}$ corresponding to the value $<A(x^{(j)}, \{\theta_k\})>$; and at a time of adjusting an l-th circuit parameter $\theta_l$ in the circuit parameter $\theta$, calculating a gradient in accordance with the following Formula (1), the gradient being calculated from a difference between a value $<A(x^{(j)}, \{\theta_l, \ldots, \theta_{l+\epsilon}, \theta_{l+l'}, \ldots\})>$ calculated from an output of the quantum circuit $U(\{\theta_k\})$ in a case in which the l-th circuit parameter $\theta_l$ is increased by a set value $\epsilon$, and a value $<A(x^{(j)}, \{\theta_l, \ldots, \theta_{l-\epsilon}, \theta_{l+l'}, \ldots\})>$ calculated from an output of the quantum circuit $U(\{\theta_k\})$ in a case in which the l-th circuit parameter $\theta_l$ is decreased by the set value $\epsilon$, and adjusting the circuit parameter $\theta_l$ in such a way as to minimize the cost function by means of a gradient method, using the calculated gradient value:

$$\frac{\partial}{\partial \theta_l} \langle A(x^{(j)}, \{\theta_k\}) \rangle = \qquad \text{[Formula 1]}$$

$$\frac{1}{2\sin(\epsilon)} (\langle A(x^{(j)}, \{\theta_1, \ldots \theta_l + \epsilon, \theta_{l+1}, \ldots \}) \rangle - \langle A(x^{(j)}, \{\theta_1, \ldots \theta_l - \epsilon, \theta_{l+1}, \ldots \}) \rangle).$$

2. The quantum circuit learning device according to claim 1, wherein the circuit parameter includes a parameter for controlling an operator operating on the quantum bits.

3. A quantum circuit learning method that causes a computer to execute a process comprising:

by a processor, providing a quantum circuit $U(\{\theta_k\})$, which includes a plurality of quantum bits, with an input signal $x^{(j)}$, wherein $\theta_k$ is a circuit parameter that defines a circuit configuration of the quantum circuit $U(\{\theta_k\})$, k is an index of the circuit parameter, and j is an index of the signal;

observing states of the quantum bits included in the quantum circuit $U(\{\theta_k\})$ and acquiring a value $<A(x^{(j)}, \{\theta_k\})>$ that is calculated from an output of the quantum circuit $U(\{\theta_k\})$ based on the observed states;

adjusting the circuit parameter $\theta_k$, using the acquired value $<A(x^{(j)}, \{\theta_k\})>$ and using a cost function that is set based on a teacher signal $y^{(j)}$ corresponding to the value $<A(x^{(j)}, \{\theta_k\})>$; and at a time of adjusting an l-th circuit parameter $\theta_l$ in the circuit parameter $\theta$, calculating a gradient in accordance with the following Formula (1), the gradient being calculated from a difference between a value $<A(x^{(j)}, \{\theta_l, \ldots, \theta_{l+\epsilon}, \theta_{l+l'}, \ldots\})>$ calculated from an output of the quantum circuit $U(\{\theta_k\})$ in a case in which the l-th circuit parameter $\theta_l$ is increased by a set value $\epsilon$, and a value $<A(x^{(j)}, \{\theta_l, \ldots, \theta_{l-\epsilon}, \theta_{l+l'}, \ldots\})>$ calculated from an output of the quantum circuit $U(\{\theta_k\})$ in a case in which the l-th circuit parameter $\theta_l$ is decreased by the set value $\epsilon$, and adjusting the circuit parameter $\theta_l$ in such a way as to minimize the cost function by means of a gradient method, using the calculated gradient value:

$$\frac{\partial}{\partial \theta_l} \langle A(x^{(j)}, \{\theta_k\}) \rangle = \qquad \text{[Formula 1]}$$

$$\frac{1}{2\sin(\epsilon)} (\langle A(x^{(j)}, \{\theta_1, \ldots \theta_l + \epsilon, \theta_{l+1}, \ldots \}) \rangle - \langle A(x^{(j)}, \{\theta_1, \ldots \theta_l - \epsilon, \theta_{l+1}, \ldots \}) \rangle).$$

4. A non-transitory recording medium storing a computer program that causes a computer to execute a process comprising:

providing a quantum circuit $U(\{\theta_k\})$, which includes a plurality of quantum bits, with an input signal $x^{(j)}$, wherein $\theta_k$ is a circuit parameter that defines a circuit configuration of the quantum circuit $U(\{\theta_k\})$, k is an index of the circuit parameter, and j is an index of the signal;

observing states of the quantum bits included in the quantum circuit $U(\{\theta_k\})$ and acquiring a value $<A(x^{(j)}, \{\theta_k\})>$ that is calculated from an output of the quantum circuit $U(\{\theta_k\})$ based on the observed states;

adjusting the circuit parameter $\theta_k$, using the acquired value $<A(x^{(j)}, \{\theta_k\})>$ and using a cost function that is set based on a teacher signal $y^{(j)}$ corresponding to the value $<A(x^{(j)}, \{\theta_k\})>$, and at a time of adjusting an l-th circuit parameter $\theta_l$ in the circuit parameter $\theta$, calculating a gradient in accordance with the following Formula (1), the gradient being calculated from a difference between a value $<A(x^{(j)}, \{\theta_l, \ldots, \theta_{l+\epsilon}, \theta_{l+l'}, \ldots\})>$ calculated from an output of the quantum circuit $U(\{\theta_k\})$ in a case in which the l-th circuit parameter $\theta_l$ is increased by a set value $\epsilon$, and a value $<A(x^{(j)}, \{\theta_l, \ldots, \theta_{l-\epsilon}, \theta_{l+l'}, \ldots\})>$ calculated from an output of the quantum circuit $U(\{\theta_k\})$ in a case in which the l-th circuit parameter $\theta_l$ is decreased by the set value $\epsilon$, and adjusting the circuit parameter $\theta_l$ in such a way as to minimize the cost function by means of a gradient method, using the calculated gradient value:

$$\frac{\partial}{\partial \theta_l} \langle A(x^{(j)}, \{\theta_k\}) \rangle = \qquad \text{[Formula 1]}$$

$$\frac{1}{2\sin(\epsilon)} (\langle A(x^{(j)}, \{\theta_1, \ldots \theta_l + \epsilon, \theta_{l+1}, \ldots \}) \rangle - \langle A(x^{(j)}, \{\theta_1, \ldots \theta_l - \epsilon, \theta_{l+1}, \ldots \}) \rangle).$$

\* \* \* \* \*